United States Patent
Oberhofer et al.

(10) Patent No.: US 9,760,593 B2
(45) Date of Patent: Sep. 12, 2017

(54) DATA DICTIONARY WITH A REDUCED NEED FOR REBUILDING

(71) Applicant: International Business Machines Corporation, Armonk, NY (US)

(72) Inventors: Martin A. Oberhofer, Bondorf (DE); Yannick Saillet, Stuttgart (DE); Jens Seifert, Gaertringen (DE)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 14/501,140

(22) Filed: Sep. 30, 2014

(65) Prior Publication Data

US 2016/0092453 A1 Mar. 31, 2016

(51) Int. Cl.
*G06F 7/00* (2006.01)
*G06F 17/00* (2006.01)
*G06F 17/30* (2006.01)
*H03M 7/30* (2006.01)

(52) U.S. Cl.
CPC .. *G06F 17/30371* (2013.01); *G06F 17/30312* (2013.01); *G06F 17/30424* (2013.01); *G06F 17/30876* (2013.01); *H03M 7/3088* (2013.01)

(58) Field of Classification Search
CPC ......... G06F 17/30371; G06F 17/30312; G06F 17/30424; G06F 17/30876; H03M 7/3088
USPC ....................................................... 707/609
See application file for complete search history.

(56) References Cited

U.S. PATENT DOCUMENTS

| | | | |
|---|---|---|---|
| 8,700,579 B2 | 4/2014 | Apanowicz et al. | |
| 2003/0030575 A1 | 2/2003 | Frachtenberg et al. | |
| 2010/0281079 A1* | 11/2010 | Marwah ................. | H03M 7/30 707/812 |
| 2011/0320418 A1 | 12/2011 | Luo et al. | |
| 2012/0117064 A1* | 5/2012 | Draese .............. | G06F 17/30592 707/737 |
| 2012/0323929 A1* | 12/2012 | Kimura ............. | G06F 17/30339 707/748 |
| 2013/0060780 A1 | 3/2013 | Lahiri et al. | |
| 2014/0085115 A1 | 3/2014 | Beier et al. | |

OTHER PUBLICATIONS

Kaur, et al., "Data Compression on Columnar-Database Using Hybrid Approach (Huffman and Lempel-Ziv Welch Algorithm)", vol. 3, Issue 5, May 2013, ISSN: 2277 128X, International Journal of Advanced Research in Computer Science and Software Engineering, pp. 889-894, © 2013, IJARCSSE.

(Continued)

*Primary Examiner* — Hosain Alam
*Assistant Examiner* — Nicholas Allen
(74) *Attorney, Agent, or Firm* — Gilbert Harmon, Jr.; Isaac Gooshaw (57) ABSTRACT

A processor receives statistical information about a data set included in a column of a data table. The processor receives additional information about the data set that indicates a data format utilized by the data set and a type of information represented by the data set. The processor generates a data dictionary for compression of the data set based, at least in part, on the statistical information and the additional information. The data dictionary is created such that the data dictionary is capable of compressing data that is statistically predicted to be received at a future point.

13 Claims, 5 Drawing Sheets

(56) References Cited

OTHER PUBLICATIONS

McKnight, et al., "Introducing Teradata Columnar", Sponsored by Teradata, pp. 1-10, provided in search report dated Apr. 30, 2014, <:https://www.google.co.in/url?sa=t&rct=j&q=&esrc=s &source=web&cd=9&cad=rja&uact=8&ved=0CF4QFjAl &url=https%3A%2F%sFwww.teradata.com%2FWhite-papers%2FTeradata-14-Hybrid-Columnar%.

"Data Dictionary With a Reduced Need for Rebuilding", U.S. Appl. No. 14/732,824, filed Jun. 8, 2015, Oct. 16, 2016.

IBM Appendix P, list of IBM patents or patent applications treated as related, pp. 1-2.

\* cited by examiner

DATA DICTIONARY WITH A REDUCED NEED FOR REBUILDING

BACKGROUND OF THE INVENTION

The present invention relates generally to the field of information management, and more particularly to data descriptions.

A data dictionary, or metadata repository, is a centralized repository of information about data such as meaning, relationships to other data, origin, usage, and format. In some cases, the term also includes one of several closely related meanings pertaining to databases and database management systems (DBMS). In one case, a data dictionary is a document describing a database or collection of databases. In another case, a data dictionary is an integral component of a DBMS that is required to determine the structure of the database. In another case, a data dictionary is a piece of middleware that extends or supplants the native data dictionary of a DBMS.

SUMMARY

Embodiments of the present invention provide a method, system, and program product for determining a data dictionary for data dictionary compression. A processor receives statistical information about a data set included in a column of a data table. The processor receives additional information about the data set that indicates one or both of a data format utilized by the data set and a type of information represented by the data set. The processor generates a data dictionary for compression of the data set based, at least in part, on the statistical information and the additional information. The data dictionary is generated such that the data dictionary is capable of compressing data that is statistically predicted to be received at a future point.

DETAILED DESCRIPTION

In known solutions, as data changes over time, the process of rebuilding of data dictionaries (used for data compression) is performed. However, such rebuilding is extremely costly in terms of input and output (I/O) to a computing system as well as processing requirements. If such rebuilding is not made in a timely fashion, access performance to data stored in the database is reduced along with compression rates. In known solutions, a challenging issue occurs because data dictionaries are wholly reliant on statistics. This makes such data dictionaries larger, less efficient and much quicker to "age" because such a dictionary cannot be built to allow for changes in the compressed data. As a data dictionary "ages" it becomes less useful, since it is increasingly unable to represent the updates made to the data included in the database. As such, at a certain age, the data dictionary is rebuilt.

An embodiment of the present invention provides a data dictionary that is built based, in part, on metadata about the column to which the data dictionary is applied. An embodiment of the present invention recognizes that such a data dictionary reduces the need for data dictionary rebuilds. An embodiment of the present invention provides combining database-processing techniques with data quality-assessment techniques to produce useful metadata as input to an algorithm for building data dictionaries that have a reduced need for data dictionary rebuilds. An embodiment of the present invention provides improved data access rates and compression. An embodiment of the present invention provides improved performance by reducing the need for rebuilding data dictionaries and reducing the cost of data storage, since the data dictionaries use less space. An embodiment of the present invention provides improved compression rates, which, in some cases, yields an increased amount of the data dictionary held in memory. An embodiment of the present invention provides improved performance by increasing levels of possible in-memory access.

The present invention will now be described in detail with reference to the Figures.

Figure 1:
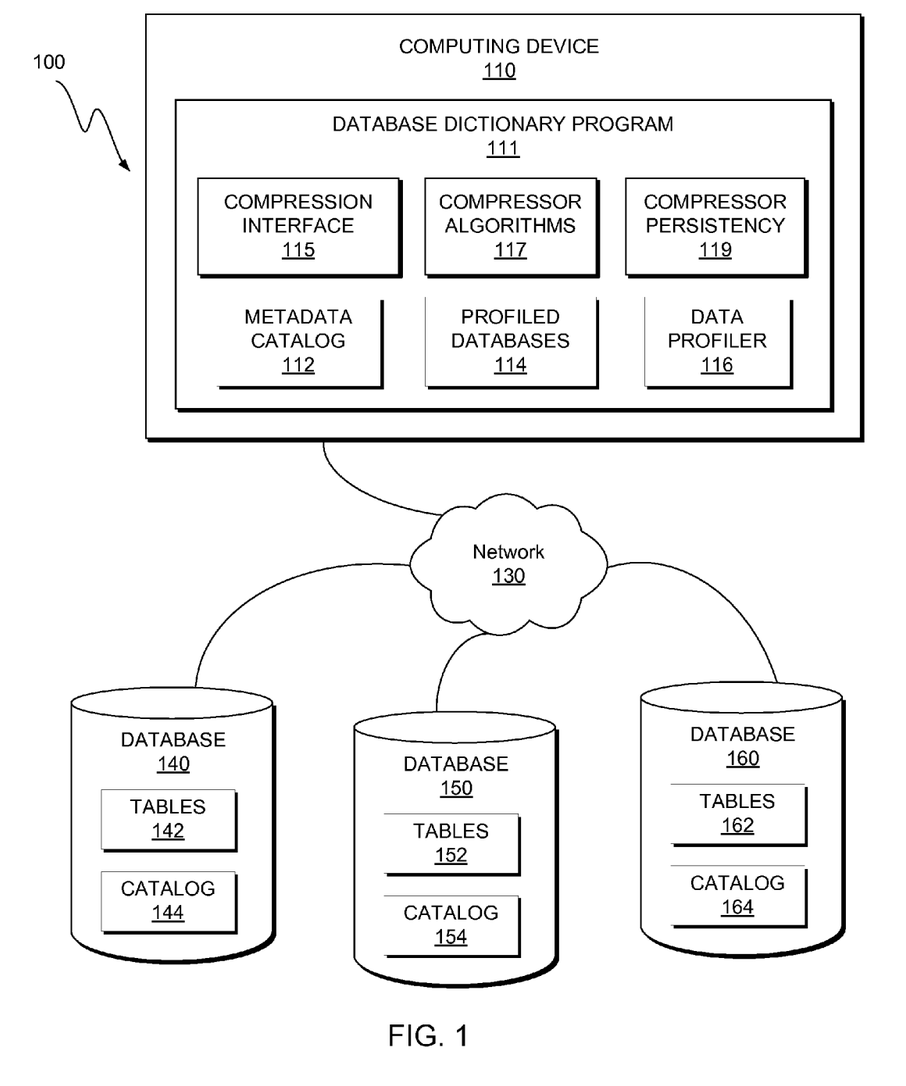
FIG. 1 is a functional block diagram illustrating an example of a database management environment, in accordance with one embodiment of the present invention.

FIG. 1 is a functional block diagram illustrating an example of a database management environment, generally designated 100, in accordance with one embodiment of the present invention. Database management environment 100 includes computing device 110 and databases 140, 150 and 160 connected over network 130. Computing device 110 includes database dictionary program 111, which further includes the following modules: compression interface 115, compressor algorithms 117, compressor persistency 119, metadata catalog 112, profiled databases 114 and data profiler 116. Database 140 includes tables 142 and catalog 144. Database 150 includes tables 152 and catalog 154. Database 160 includes tables 162 and catalog 164.

In various embodiments of the present invention, computing device 110 and databases 140, 150 and 160 are computing devices that can respectively be a standalone device, a server, a laptop computer, a tablet computer, a netbook computer, a personal computer (PC), or a desktop computer. In another embodiment, one or more of computing device 110 and databases 140, 150 and 160 respectively represent a computing system utilizing clustered computers and components to act as a single pool of seamless resources. In general, in one embodiment, computing device 110 and databases 140, 150 and 160 are any computing device or a combination of devices with access to database dictionary program 111, compression interface 115, compressor algorithms 117, compressor persistency 119, metadata catalog 112, profiled databases 114, data profiler 116, tables 142, 152 and 162, and catalogs 144, 154 and 164; and is capable of executing database dictionary program 111. In one embodiment, one or more of computing device 110 and databases 140, 150 and 160 include internal and external hardware components, as depicted and described in further detail with respect to FIG. 5.

In this embodiment, database dictionary program 111, compression interface 115, compressor algorithms 117, compressor persistency 119, metadata catalog 112, profiled databases 114, data profiler 116, tables 142, 152 and 162, and catalogs 144, 154 and 164 are respectively stored on computing device 110 and databases 140, 150 and 160. However, in other embodiments, one or more of database dictionary program 111, compression interface 115, compressor algorithms 117, compressor persistency 119, metadata catalog 112, profiled databases 114, data profiler 116, tables 142, 152 and 162, and catalogs 144, 154 and 164 are stored externally and accessed through a communication network, such as network 130. Network 130 can be, for example, a local area network (LAN), a wide area network (WAN) such as the Internet, or a combination of the two, and may include wired, wireless, fiber optic or any other connection known in the art. In general, network 130 can be any combination of connections and protocols that will support communications between computing device 110, databases 140, 150 and 160, database dictionary program 111, compression interface 115, compressor algorithms 117, compressor persistency 119, metadata catalog 112, profiled databases 114, data profiler 116, tables 142, 152 and 162, and catalogs 144, 154 and 164, in accordance with a desired embodiment of the present invention.

As used herein, a data dictionary in a database is a compressed representation of data values in a column of a table included in the database. In one embodiment, the compression does not need to be the same for all values and data dictionaries in databases are comprised of a number of areas. For example, a database includes three storage areas. One storage area is an uncompressed area and the remaining two storage areas are compressed using different compression schemes (e.g., 32 bit, Lempel-Ziv-Renau (LZR) and Huffmann). The uncompressed area stores un-encoded values, which are exception values in the column that break a pattern, e.g., two strings in a column which otherwise only contains integers. Such an un-encoded value area typically stores a very small fraction of values in a column. Otherwise, in certain embodiments, the point of compressed data in data dictionaries is less effective.

In general, data dictionaries reduce storage cost and improve performance by increasing the amount of data held in-memory for quicker access. In one embodiment, a good data dictionary is defined as having the following characteristics: 1) provides data compression; 2) is order preserving, which provides the benefit of making comparisons efficiently (e.g. >, <, in between, etc.); 3) is cheap to encode/decode, which is typically useful if the column has a lot of updates (sometimes based on database statistics); and 4) supports arithmetic operations (e.g. being able to compute timestamp operations as integers).

General-purpose compression techniques like Lempel-Ziv-Renau (LZR) or Huffmann compress data by reducing the number of bits required to store it. These approaches provide loss-less compression using statistical redundancy. It is to be noted that general purpose compression techniques like LZR are not order preserving, nor do they allow arithmetic operations. For compressing data in databases, general-purpose compression techniques are often applied for data as well as index structures. Application of compression techniques to index structures often results in an increase in access rates to the data in the database. Compressed data and index structures are updated as changes to the data included in the database occur. As such, the data dictionaries used for compression "age" and become less useful and efficient regarding compression and decompression of data as more changes to the data are made.

In some cases, aging of a data dictionary leads to one or more scenarios. In a first scenario, a need to rebuild data dictionaries results in order to maintain an efficient and effective compression and retrieval of data. Rebuilding a data dictionary is both I/O and computationally intensive. Further, re-encoding the existing data with the new dictionary is also I/O and computationally intensive. In a second scenario, degradation of performance occurs. For example, because bad or uncompressed data utilizes more memory, the loss in available memory results in a slowing of data retrieval.

In accordance with various embodiments, database dictionary program 111 includes columnar dictionaries (a type of data dictionary) that are used for columnar dictionary-based compression of data included in databases. For example, the data included in databases 140, 150 and 160 of FIG. 1. In some embodiments, database dictionary program 111 includes the functionality and permissions needed to execute the compressions using the columnar dictionaries. In other embodiments, database dictionary program 111 provides the columnar dictionaries to another program or computing device, such as databases 140, 150 and 160, which executes the compression.

In this embodiment, to generate a columnar dictionary, database dictionary program 111 retrieves or receives a plurality of types of data from one or more of compression interface 115, compressor persistency 119, metadata catalog 112, profiled databases 114, data profiler 116, and databases 140, 150 and 160. Database dictionary program 111 passes this information to a compression algorithm included as part of compressor algorithms 117. The compression algorithm included as part of compressor algorithms 117 generates a result in the form of a columnar dictionary, which is then saved as part of database dictionary program 111. An example of such an algorithm is illustrated in FIG. 4. The functioning of database dictionary program 111 is further expanded upon in the discussion of FIG. 3 below.

In one embodiment, in general, database dictionary program 111 generates a data dictionary by combining database, data profiling and data integration techniques. The result is a data dictionary (e.g., a columnar dictionary) that is more resilient against aging. To generate such a data dictionary, database dictionary program 111 exploits metadata of the data in the data column, which is compressed. As such, the resulting data dictionary utilizes domain knowledge (including metadata) from the data that it compresses to adapt to changes in the data (i.e., the data dictionaries evolve as changes to the data in the database occur).

In this embodiment, metadata is defined as data that provides information about one or more aspects of other data to which it refers or is associated with. For example, metadata indicates one or more of a means of creation of the data, a purpose of the data, a time and date of creation, a creator or author of the data, a location on a computer network where the data were created, and standards that were applied during the creation, etc. In general, metadata is simply data about data. There are two types of metadata, namely structural and descriptive. Structural metadata includes information pertaining to the design and specification of data structures and often indicates details regarding the containers that include data. Descriptive metadata, on the other hand, is about individual instances of application data and the data content itself. In general, the main purpose of metadata is to facilitate in the discovery of relevant information regarding a particular resource. In some embodiments, metadata aids in the organization of electronic resources, provides digital identification, and helps support archiving and preservation of the resource (e.g., the data included in databases 140, 150 and 160). In some embodiments, one or more modules of database dictionary program 111, and databases 140, 150 and 160, use metadata to assist in the discovery of electronic resources by allowing those resources to be identified using relevant criteria, previously identified resources, the bringing of similar resources together, the distinguishing of dissimilar resources, and the giving of location information.

In this embodiment, domain knowledge comes from at least the following different types of sources: metadata sources, database statistics, data profiling and user input.

In this embodiment, metadata comes from sources such as metadata repositories, business glossaries, etc. containing information about the data in the data column to be compressed (e.g., metadata catalog 112). Examples include value ranges expressed by business rules, data types, referential data integrity constraints, etc. Managing metadata is an established functionality set in the data integration domain. In this embodiment, database metadata comes from a database catalog. In some cases, such database metadata includes information such as data integrity constraints, data types, etc.

In this embodiment, data profiler 116 conducts data profiling and generates insight into the data of a particular data column such as, for example, used value ranges, inferred data types, statistical on value distribution, patterns, etc. In this embodiment, such data profiling also reveals the format of values. As such, in some scenarios, regular expressions or format rules that describe the structure and pattern(s) of all values in a column are available. In this embodiment, such data profiling also reveals inferred data types. For example, a column with a declared string type might only hold numbers in the "small integer" range. As such, the most accurate data type representing the column is "small integer" as opposed to string, since "small integer" governs the value range in the column more accurately. Such information is included as part of profiled databases 114.

In this embodiment, database dictionary program 111 also uses database statistics of values in a column to supplement the metadata. It should be noted that, in this embodiment, it is required that such database statistics be current (i.e., reflect the actual values in the column).

In this embodiment, database dictionary program 111 also makes use of user input, from compression interface 115, as a source of metadata or domain knowledge. For example, a user might know details about the data domain stored in a column and inputs these details into compression interface 115, which passes this information to database dictionary program 111.

The domain knowledge from these sources is combined with parameters such as: monotony of values (e.g., increases and decreases in repetition of a value in the column); variability of values; excluded value ranges; and growth range of values (e.g., birth dates for the last 120 years+15 more years for assumed lifetime of application).

With such domain knowledge, database dictionary program 111 builds data dictionaries that age less quickly and have an increased degree of accuracy.

Figure 2:
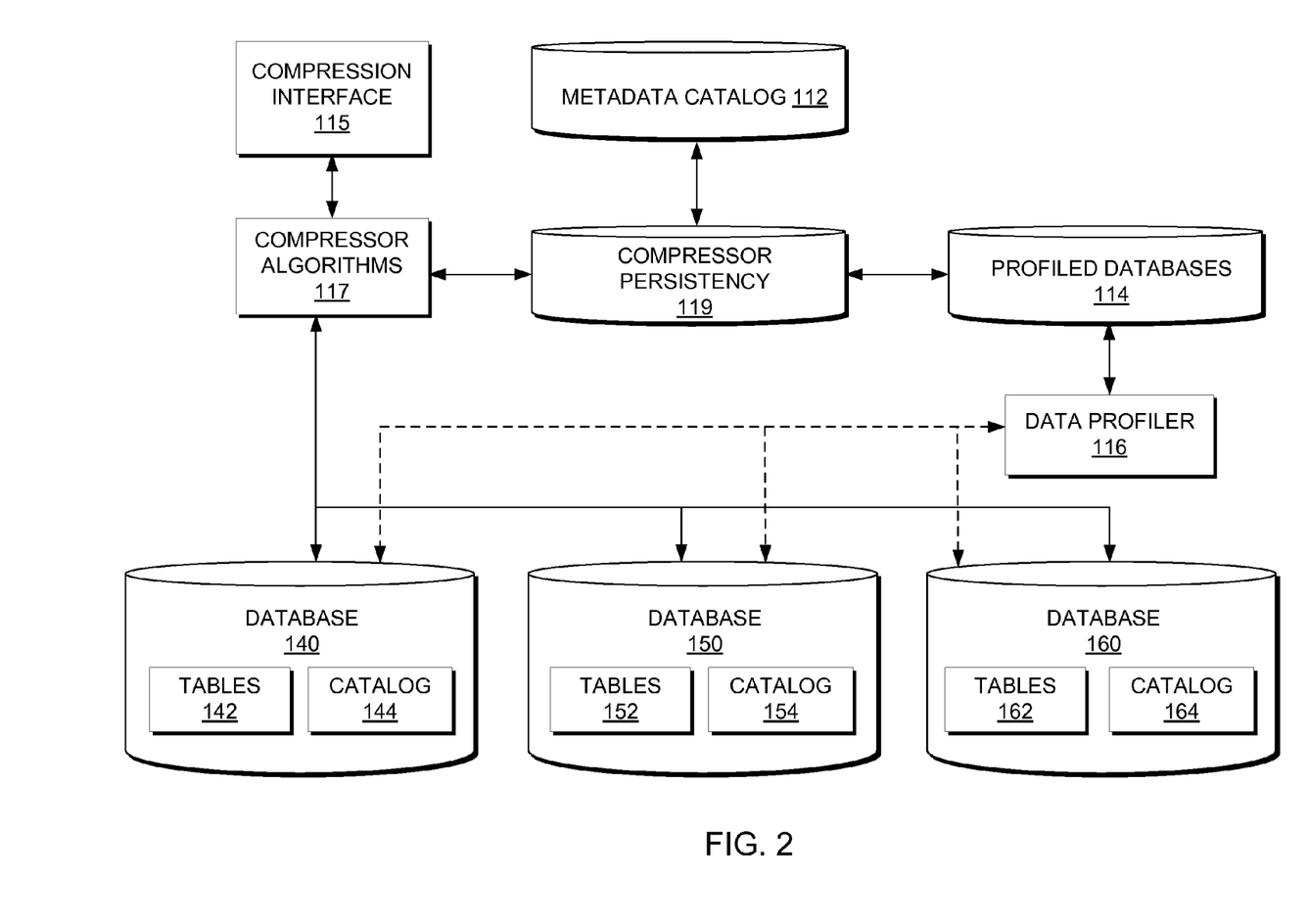
FIG. 2 illustrates the connectivity and interaction of certain modules of a database dictionary program and the databases of the database management environment of FIG. 1, in accordance with one embodiment of the present invention.

FIG. 2 illustrates the connectivity and interaction of certain modules of database dictionary program 111 and databases 140, 150 and 160 of the database management environment 100, in accordance with one embodiment of the present invention.

In this embodiment, compression interface 115 is a compression user interface (UI). Compression interface 115 is a user interface configured to receive, from a user, domain knowledge about a column, for which a data dictionary will be built by database dictionary program 111. Compression interface 115 is further configured to allow users to review all metadata known to database dictionary program 111 and complement or correct it as needed. As an option in this embodiment, compression interface 115 is further configured to allow a user to initiate creation or re-creation of data dictionaries. Note that database dictionary program 111 also automatically initiates re-creation of data dictionaries.

In this embodiment, compressor algorithms 117 is a software module that provides compression algorithms for the data dictionaries to database dictionary program 111. The compression algorithms of compressor algorithms 117 consider user input as well as all relevant metadata from compressor persistency 119.

In this embodiment, compressor persistency 119 is a block of memory that is used by database dictionary program 111 (specifically compressor algorithms 117 and compression interface 115) to manage the metadata used by compression techniques that utilize the data dictionaries generated by database dictionary program 111. For example, compression techniques applied to data included in one or all of databases 140, 150 and 160. Compressor persistency 119 has import and interface features to consume metadata from the metadata catalog 112, the profiled databases 114 and the catalogs 144, 154 and 164 of databases 140, 150 and 160. (the later through database dictionary program 111/ compressor algorithms 117). In certain embodiments, user input is also stored as part of compressor persistency 119 as well as data relevant to the management of created data dictionaries (e.g., which parameters where used to create, when the dictionary was created, etc.).

In this embodiment, metadata catalog 112 is a catalog of metadata for a given database. In some embodiments, metadata software that provides metadata catalog functionality generates the catalog of metadata. One skilled in the art knows of such metadata software. As such, an in depth description of the functioning of such software exceeds the bounds of this description. Metadata catalog 112 includes a metadata catalog that stores descriptive information (metadata) about logical data items included in a given database (e.g., databases 140, 150 and 160). The metadata catalog includes a common vocabulary that provides understanding of context and usage of a given piece of data.

In this embodiment, profiled databases 114 include a list of databases and their respective profiles that have been profiled by, for example, data profiler 116. This list of databases includes databases with database catalogs containing metadata, statistics and data tables. For example, databases 140, 150 and 160 respectively include tables 142, 152 and 162, and catalogs 144, 154 and 164. As such databases 140, 150 and 160 are included as part of the list of databases of profiled databases 114.

In this embodiment, data profiler 116 is a type of general-purpose data profiling software. One skilled in the art knows of such data profiling software. As such, an in depth description of the precise functioning of such software exceeds the bounds of this description. However, a more general discussion of the functions supported by data profiler 116 follows hereafter.

Data profiler 116 stores profiling results as part of profiled databases 114. In general, data profiling is the process of examining the data available in an existing data source (e.g., a database or a file) and collecting statistics and information about that data. Such profiling often generates various types of information and functionality. For example, profiling reveals whether existing data is usable for other purposes. In another example, data profiling improves the ability to search the data by tagging it with keywords, descriptions, or assigning it to a category. In another example, data profiling provides metrics on data quality, including whether the data conforms to particular standards or patterns. In another example, data profiling assesses the risk involved in integrating data for new applications, including the challenges of joins. In another example, data profiling assesses whether metadata accurately describes the actual values in the source database.

In general, data profiling is an analysis of the candidate data sources for a data warehouse (e.g., a database) to clarify the structure, content, relationships and derivation rules of the data included therein. Data profiling helps not only to understand anomalies and to assess data quality, but also to discover, register, and assess enterprise metadata. Thus, data profiling both validates metadata when it is available and discovers metadata when it is not available.

Data profiling utilizes different kinds of descriptive statistics such as minimum, maximum, mean, mode, percentile, standard deviation, frequency, and variation as well as other aggregates such as count and sum. Additional metadata information obtained during data profiling is, for example, uniqueness, data type, length, discrete values, occurrence of null values, typical string patterns, and abstract type recognition. Data profiler 116 uses the metadata to discover problems such as illegal values, misspelling, missing values, varying value representation, and duplicates.

Data profiler 116 applies a variety of different analyses for different structural levels. For example, data profiler 116 profiles single columns individually to determine an understanding of a) frequency distribution of different values, b) types of values, and c) uses of each column. In another example, data profiler 116 exposes embedded value dependencies using a cross-columns analysis. In a final example, data profiler 116 explores potential overlapping value sets using an inter-table analysis. In some cases, such overlapping value sets represent foreign key relationships between entities, which data profiler 116 notes if they exist. Typically, a purpose-built tool executes such data profiling activities. In this embodiment, data profiler 116 represents such a tool. In some embodiments, data profiler 116 is configured to facilitate changing demands in computation complexity, which varies between single column, single table, and cross-table structural profiling.

In this embodiment, tables 142, 152 and 162 are data tables that are respectively included as part of databases 140, 150 and 160. Tables 142, 152 and 162 represent collections of related data held in a structured format within a database. Tables 142, 152 and 162 consist of fields (columns), and rows. In some embodiments, tables 142, 152 and 162 are included as part of relational databases and flat file databases. In such embodiments, tables 142, 152 and 162 include a set of data elements (values) using a model of vertical columns (which are identified by their names) and horizontal rows, the cell being the unit where a row and column intersect. In some embodiments, tables 142, 152 and 162 respectively have a specified number of columns, but have a variable number of rows. In some embodiments, one or more modules of database dictionary program 111 identify each row by the values appearing in a particular column subset, which the one or more modules of database dictionary program 111 identify as a unique key index.

In the context of a relational database table, a column is a set of data values of a particular simple type, one for each row of the table. Such columns provide, for example, databases 140, 150 and 160 with structure based, in part, on the format of the rows. As used herein, a field (or field value) refers specifically to the single item that exists at the intersection between one row and one column. For example, a table that represents companies might have the following columns: ID (integer identifier, unique to each row), Name (text), Address line 1 (text), Address line 2 (text), City (integer identifier, drawn from a separate table of cities, from which any state or country information would be drawn), Postal code (text), Industry (integer identifier, drawn from a separate table of industries). Each row provides a data value for each column, which one or more modules of database dictionary program 111, databases 140, 150 and 160 understand as a single structured data value in this example representing a company. In some embodiments, one or more modules of database dictionary program 111, databases 140, 150 and 160 interpret each row as a "relvar", composed of a set of tuples, with each tuple consisting of two items: a) the name of the relevant column and b) the value a row provides for that column.

In this embodiment, catalogs 144, 154 and 164 represent database catalogs of databases 140, 150 and 160. Catalogs 144, 154 and 164 include database instances consisting of metadata in which definitions of database objects are stored. For example, such definitions of the database objects include base tables, views (virtual tables), synonyms, value ranges, indexes, users, and user groups.

In some embodiments, one or more modules of database dictionary program 111 are included as part of databases 140, 150 and 160. However, in this embodiment modules of database dictionary program 111 are all located on computing device 110, which services databases 140, 150 and 160.

Figure 3:
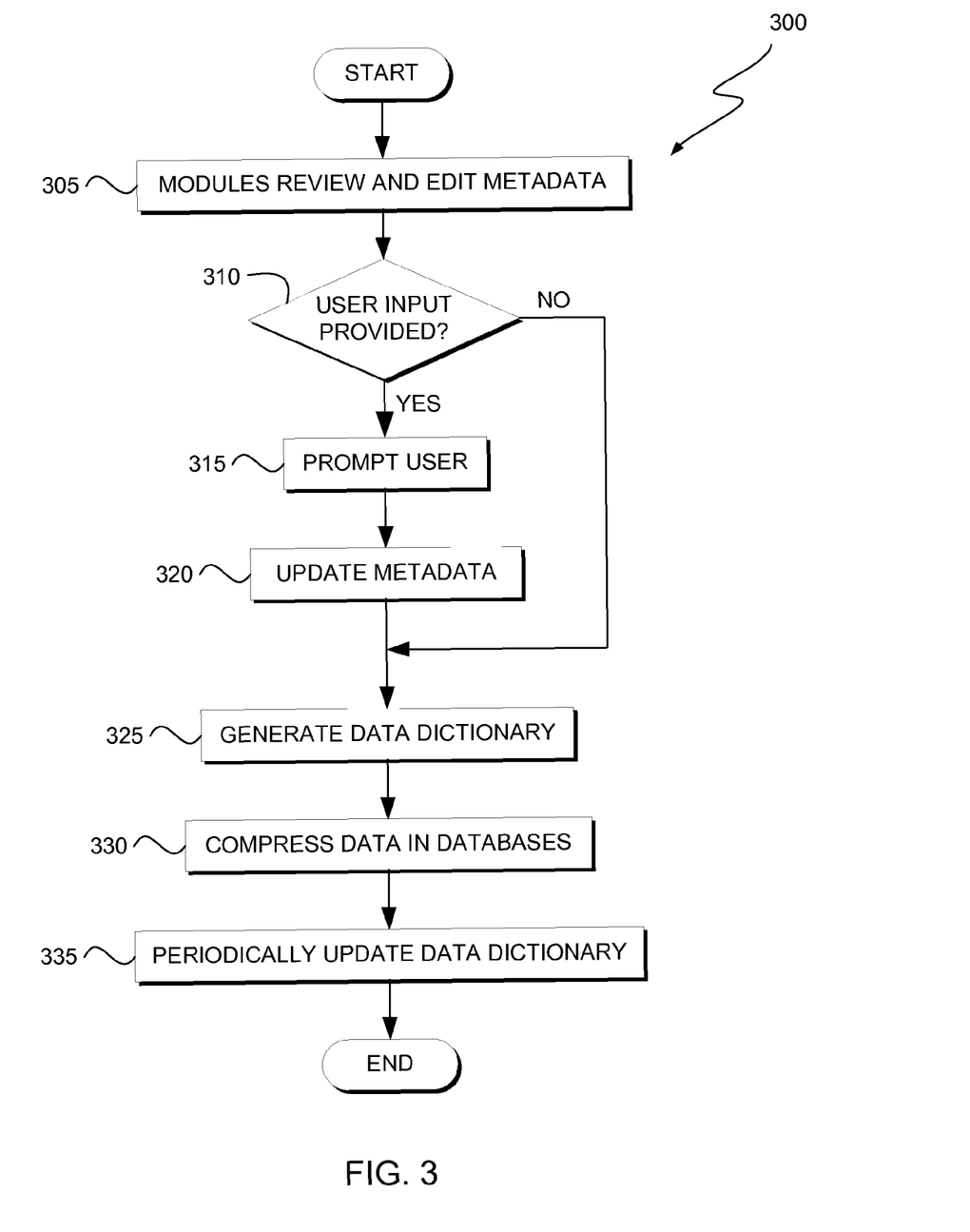
FIG. 3 is a flow diagram illustrating the processes of a database dictionary program, executing on a computing device within the environment of FIG. 1, in accordance with one embodiment of the present invention.
Figure 4:
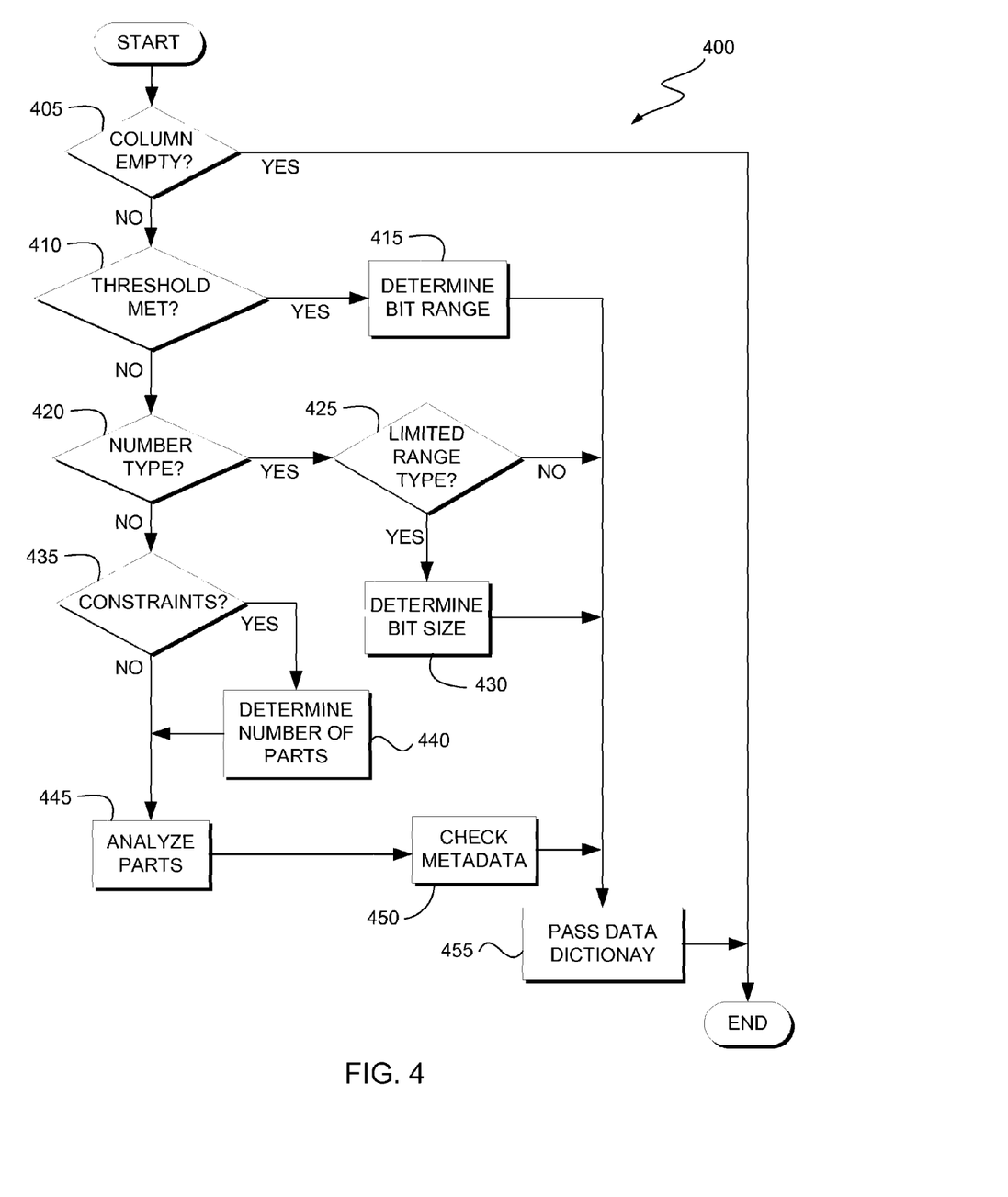
FIG. 4 illustrates operational processes of a compression algorithm used by the database dictionary program, of FIG. 3, to generate columnar dictionaries, in accordance with one embodiment of the present invention.

FIG. 3 is a flow diagram, 300, illustrating the operational processes of database dictionary program 111, executing on computing device 110 within the environment of FIG. 1, in accordance with one embodiment of the present invention. For ease of understanding, the processes of database dictionary program 111 are explained below, in part, using the modules included in database dictionary program 111, as described above.

In process 305, one or more modules (e.g., metadata catalog 112, profiled databases 114 and data profiler 116) reviews and edits (as needed) the metadata included in compressor persistency 119. Metadata catalog 112, profiled databases 114 and data profiler 116 all include the required programming and permissions to review and edit the metadata included in compressor persistency 119. In this embodiment, metadata catalog 112, profiled databases 114 and data profiler 116 periodically update the metadata included in compressor persistency 119. In certain embodiments, metadata catalog 112, profiled databases 114 and data profiler 116 update the metadata included in compressor persistency 119 in response to a trigger. For example, changes in a particular type of metadata are known to inhibit the functionality of the data dictionary for databases 140, 150 and 160. As such, if any of metadata catalog 112, profiled databases 114 or data profiler 116 identifies such a change they update the metadata included in compressor persistency 119 accordingly.

In decision process 310, database dictionary program 111 determines whether there is any user input being provided via compression interface 115 that is not already reflected in the metadata included in compressor persistency 119. If there is no user input that is not already reflected in the metadata included in compressor persistency 119 (decision process 310, NO branch), then database dictionary program 111 proceeds to process 325. If there is user input that is not already reflected in the metadata included in compressor persistency 119 (decision process 310, YES branch), then database dictionary program 111 prompts the user, via compression interface 115, to verify the user input, in process 315.

In process 320, compression interface 115 updates the metadata included in compressor persistency 119, in response to verification of the user input. In this embodiment, if the user input is altered in response to the prompt of process 315, then compression interface 115 determines that the altered input is verified and that input is used to update the metadata included in compressor persistency 119.

In process 325, database dictionary program 111 generates a data dictionary for one or more of databases 140, 150 and 160 using the updated metadata included in compressor persistency 119 in combination with an algorithm included in compressor algorithms 117. The process of using an algorithm included in compressor algorithms 117 to generate a data dictionary is explained in further detail, below, during the discussion of FIG. 4.

In process 330, database dictionary program 111 compresses the data included in one or more of databases 140, 150 and 160 using the data dictionary created in process 325. In general this compression is applied based on select parts of the dictionary for various types of compression. For example, such types of compression include prefix compression, suffix compression, bit compression, and LZR compression, etc. In other embodiments, database dictionary program 111 passes the data dictionary created in process 325 to one or more of databases 140, 150 and 160, which in turn use the data dictionary for compression of data.

In process 335, database dictionary program 111 periodically updates the data dictionary created in process 325. For example, in one embodiment, as part of this updating process, database dictionary program 111 determines whether or not the data dictionary created in process 325 has "aged" beyond a predefined threshold. In one such embodiment, if the data dictionary created in process 325 did "age" beyond a predefined threshold, then database dictionary program 111 returns to process 305. However, if the data dictionary created in process 325 did not "age" beyond the predefined threshold, then database dictionary program 111 waits a pre-determined period before checking again. Note that in other embodiments, the process utilized by database dictionary program 111 to periodically update the data dictionary created in process 325 varies. As such, in FIG. 3, process 335 is shown as simply proceeding to "end", however, in other embodiments, process 335 proceeds to one or more decision processes and process steps, such as those described in the previous example.

To aid in understanding of certain examples included below, for at least the discussion of FIG. 4, the following definitions are provided:

In this embodiment, a d-ratio is a number of distinct values divided by a number of total values in column. If the d-ratio is below a certain configurable threshold (e.g., 0.001), then the values in a column are treated as a limited set of constant values. For example, for fields linked to reference tables, 200 distinct country codes in a country code column of a customer master data is divided by 200 million values (due to the existence of 200 million customer records), which yields a d-ratio of 0.000001.

In this embodiment, low count data types are data types with a very small value range. For example, low count data types include, a unit of digital information such as a byte, a data type with only two possible values: true or false (e.g., a Boolean), data type stores small whole numbers (e.g., whole numbers with five or fewer digits), a fixed-length string data, and a variable-length string data, all of which have a length less than or equal to four bytes. As such these data types are considered low count data types.

FIG. 4 is a flow diagram, 400, illustrating the operational processes of an example compression algorithm (included as part of compressor algorithms 117), which is used by database dictionary program 111 to generate columnar dictionaries, in accordance with one embodiment of the present invention.

In general, the illustrated algorithm executes five overall processes. The algorithm receives domain knowledge, e.g., the metadata included in compressor persistency 119. The algorithm analyzes this domain knowledge and parameters of the data to be compressed. The algorithm determines a compression strategy that will meet the analyzed parameters and that accounts the results of the analysis of the domain knowledge. Last, the algorithm generates a data dictionary based, in part, on the determined compression strategy. Note that the exemplary algorithm illustrated as flow diagram 400 is not to be interpreted as limiting, as many variations on such an algorithm are possible.

In decision process 405, the algorithm determines whether the column being examined is empty. If the domain knowledge due to one or both of data profiling results and statistics from the database surface indicate that a particular column is empty, then there is no need to build a data dictionary. As such, if the algorithm determines that the column being examined is empty (decision process 405, YES branch), then the algorithm ends. However, if the algorithm determines that the column being examined is not empty (decision process 405, NO branch), then the algorithm proceeds to decision process 410.

In decision process 410, the algorithm determines whether one or more thresholds have been met that indicate that a very small data dictionary is required. In this embodiment, the algorithm determines that a small data dictionary is required if either one of the following conditions is met: a) the column has a d-ratio with a low number of distinct values in the column but the column itself has a comparatively large of entries. Such a scenario suggests that those values are a fixed domain and the algorithm treated them as such. If this threshold is met, then the algorithm creates a small dictionary for this low number of distinct values. b) the algorithm determines that the column includes only data types with a small number of distinct values, i.e., low count data types. For example, the column only includes low count data types with a length less than or equal to four bytes.

If the algorithm determines that one or more thresholds have been met (decision process 410, YES branch), then the algorithm proceeds to process 415. In process 415, the algorithm determines the bit range for the types of data included in the column. The algorithm then proceeds to process 455. If the algorithm determines that one or more thresholds have not been met (decision process 410, NO branch), then the algorithm proceeds to decision process 420.

In decision process 420, the algorithm determines whether the data type of the column entries are number types. In this embodiment, the algorithm interrogates the domain knowledge included in compressor persistency 119 to determine whether it includes one or both of database metadata indicating a number and profiling results indicating a number data type. If the algorithm determines that the data type of the column entries are not number types (decision process 420, NO branch), then the algorithm proceeds to decision process 435. If the algorithm determines that the data type of the column entries are number types (decision process 420, YES branch), then the algorithm proceeds to decision process 425.

In decision process 425, the algorithm determines whether the number type is a limited-range number type. As used herein, a number range is considered limited (i.e., a limited-range number type) if that range has both an upper and a lower bound. If the range is lacking one or both of the upper bound and lower bound, then that range is not limited (i.e., it is an unlimited-range number type). If the algorithm determines that the number type is a not a limited-range number type (decision process 425, NO branch), then the algorithm proceeds to process 455. For example, the algorithm determines that the number type data is variable-length string data with a range that lacks both an upper and lower bound. As such, the algorithm determines that the number type is not a limited-range number type and proceeds to process 455.

If the algorithm determines that the number type is a limited-range number type (decision process 425, YES branch), then the algorithm proceeds to process 430. For example, the algorithm determines that the number type data is a fixed-length string data with a range that includes both an upper and lower bound. As such, the algorithm determines that the number type is a limited-range number type and therefore proceeds to process 430.

In process 430, the algorithm determines the actual bit size required to store the limited-range number type data. For example, to accommodate representations of data type "A", a software company decided to declare a variable-length string data of 42 bytes instead of a timestamp data type and they stored the data values like this in the column: 20130608231454. Notice that this is a 14 digit integer and a profiling analysis executed by the algorithm finds that all values in a variable-length string data of 42 bytes are 14-digit integers, which indicates an inferred integer data type. In this case, the algorithm performs a deep inspection of the integer value range with a series of tests and reveals that these integers are all timestamps. As such, the algorithm reduces the total number of possible values for those integers to the smaller timestamp range, which is smaller than the range of the variable-length string data of 42 bytes. In this case, the series of tests to determine if the 14-digit integers are representing timestamps include one or more of: a) first digit within 0, 1, 2; b) $5^{th}$ digit only 0 or 1; and c) $9^{th}$ digit only 0, 1, 2. In some embodiments, the algorithm also completes similar tests for 8-digit integers to determine "date" type, or for 6-digit integer to determine if the data represents a "time" value range. The algorithm then proceeds to process 455.

If, in decision process 420, the algorithm determines that the data type of the column entries are not number types, then, in decision process 435, the algorithm determines whether there are any constraints that are included in the regular expressions of the column. For example, the algorithm analyzes the domain knowledge and determines whether the value range in the column is expressible as a regular expression. The algorithm also performs an analysis to determine if the regular expression contains prefixes, suffixes or other constants. If the algorithm determines that there are no constraints included in the regular expressions of the column (decision process 435, NO branch), then the algorithm proceeds to process 445. If the regular expressions do contain prefixes, suffixes or constants, or other constraints (decision process 435, YES branch), then, in process 440, the algorithm determines how many parts the data dictionary will need to store the limited value ranges in prefix and suffix areas and then proceeds to process 445.

In process 445, the algorithm analyzes the parts of the regular expressions. As part of this analysis, the algorithm determines how many different values are possible for the regular expression parts. The algorithm performs an analysis that utilizes insights from the data profiling as well as from database statistics (if available) and determines how many different values are possible for the regular expression parts.

In process 450, the algorithm checks the metadata included in compression persistency 119 and adjusts the intermediate results of the data dictionary computed so far (see processes 405 through 445) by factoring in additional metadata and parameter information to fine-tune the data dictionary sizes. After the algorithm finishes fine-tuning the data dictionary the algorithm passes the completed data dictionary to database dictionary program 111 for use in compression activity, in process 455.

To further illustrate how such an algorithm works the following is a description of five embodiments based on example scenarios.

In the first embodiment and scenario, the algorithm receives input in the form of a "Declared Data Type: String(30)". Data profiling revealed: a) Detected pattern: phone number; b) characters are limited to 15 characters: 0-9, +, −, /, (, ); c) Substring patterns: First 5 characters are international dial codes with a fixed value set; and d) Variability: very low (no expectations that letters or other special characters will become part of the string because data profiler 116 did not record any violating values containing characters beyond the above 15).

As a first step in the first embodiment, the algorithm analyzes the domain knowledge. In this step, in this example, with the access to the data profiling results, the algorithm generates a regular expression for the phone number. For example, [+,0-9]*5[−,/]*(0-1)[(,)0-9]*(9-12). Further, by exploiting the substring knowledge, the algorithm further optimizes the regular expression for the phone number by breaking the string into two parts: 1) For all international dialing codes compress them separately in the data dictionary; and 2) Use [−,/]*(0-1)[(,)0-9]*(9-12) for the remaining substring.

As a second step in the first embodiment, the algorithm analyzes the parameters. In this step, since data profiler 116 did not find any violators, the variability setting is set to "very low". As a third step in the first embodiment, the algorithm determines a compression strategy for data dictionary. In this scenario, based on the findings of step one and two the algorithm would use a regular expression-based compression strategy.

As a fourth step in the first embodiment, the algorithm generates a data dictionary that includes the following parameters: a) fixed length 4-bit encoding (4-bit encoding is sufficient to store 16 different values); b) compression and decompression is extremely inexpensive; c) comparison can be done easily on compressed data; d) the dictionary can be built order preserving; and e) extraction of parts of the compressed data easy (e.g., everything between two brackets ( ), without decoding data).

In the second embodiment and scenario, the algorithm receives input in the form of a "Declared data type: String (1)". Data profiling revealed: a) three values: M, F, null (gender has not been set); and b) no exceptions were found for these 3 values. In this scenario, a user marked the column as gender and confirmed that the three values are only permissible values explicitly.

As a first step in the second embodiment, the algorithm analyzes the domain knowledge. In this step, in this scenario, the algorithm would determine, based on the profiling results and the human user input, that the data dictionary will only need three values: M, F and null. As a second step in the second embodiment, the algorithm analyzes the parameters. In this scenario since the human user declared the value set explicitly as static, the algorithm sets the variability parameter to zero. As a third step in the second embodiment, the algorithm determines a compression strategy for data dictionary. In this scenario, the algorithm determines that a static dictionary with three values is required to compress the data.

As a fourth step in the second embodiment, the algorithm generates a data dictionary that includes the following parameters: a) fixed length two bit encoding; b) is order preserving.

In the third embodiment and scenario, the algorithm receives input in the form of a "Declared data type: Date". Data profiling revealed: a) date values between 1892 and 2013; b) suggested birth year as data domain; c) due to data quality issues in approximately 10 million records 10,000 dates which were not year numbers where found; and d) a user added metadata indicating that the values should be allowed as far as 2028 and confirmed birth year as the data domain.

As a first step in the third embodiment, the algorithm analyzes the domain knowledge. In this step, in this scenario, the algorithm determines that ninety-nine percent of the values represent integer numbers, which can be stored more efficiently as integers than dates in the data dictionary. Furthermore, not the full value range needs to be considered, since the data dictionary can be optimized to anticipate a range from 1892 to 2028.

As a second step in the third embodiment, the algorithm analyzes the parameters. In this scenario, since only one percent of the values violate the compliance with year numbers, the variability parameter is set to "very low". As a third step in the third embodiment, the algorithm determines a compression strategy for data dictionary. In this scenario, the algorithm defines a data dictionary strategy by dividing the space into two areas. The first area includes two percent of the data dictionary size, which is used for the year violators, thereby allowing growth with a generic compression algorithm for this area. The second area includes ninety-eight percent of the space for a data dictionary, anticipating only integer numbers between 1892 and 2028.

As a fourth step in the third embodiment, the algorithm generates a data dictionary that includes the following parameters: a) include space for the next ten years; b) predict the frequency of births for the next ten years using the frequencies of the previous ten years (assuming that the birth rate does not greatly increase or decline); and c) use the average birth rates of the last twenty to fifty years to create the dictionary if there exists only a few records in the column.

In the fourth embodiment and scenario, the algorithm receives input in the form of a "Declared data type: String (150)". Data profiling revealed: a) each string has an @ character; b) characters found are limited to letters, numbers, '@' and '.'; c) suggests email address as data domain; and d) Patterns: frequently recurring patterns include '.com', '.gov', '.us', '.de', etc.

As a first step in the fourth embodiment, the algorithm analyzes the domain knowledge. In this step, in this scenario, based on the data profiling results, the algorithm determines that the values allow regular expressions to be used for creating the data dictionary. Furthermore, since patterns are found for the whole string as well as sub-strings, the algorithm determines to use: 1) a generic regular expression of [a-z,0-9]*50[@]1; and 2) a suffix string compression for the frequently found patterns.

As a second step in the fourth embodiment, the algorithm analyzes the parameters. In this scenario, the algorithm sets the variability parameter as "high" since no monotony exists in the values. As a third step in the fourth embodiment, the algorithm determines a compression strategy for data dictionary. In this scenario, the algorithm defines a data dictionary strategy that compresses this column using regular expressions for main part and using suffix compression for frequently found patterns.

As a fourth step in the fourth embodiment, the algorithm generates a data dictionary that includes the following parameters: a) use well known LZW algorithms that replace the common suffixes like @xxxxmail.com to a symbol; b) if only a few values are available, use frequency knowledge of the suffixes to build the LZW dictionary instead of using just the few values currently available; c) adjust the compression with the knowledge of allowed characters for e-mail addresses (A-Z,a-z,0-9.-,_); and d) use a fixed encoding for content existing before an "@" symbol and a dictionary based approach content existing after the "@" symbol.

In the fifth embodiment and scenario, the algorithm receives input in the form of a "Declared data type: String (5)". Data profiling revealed: 1) seventy-eight distinct values, all of type integers; 2) a Total number of values: over 1 million; and 3) Metadata from the database catalog revealed that column in data table has a foreign key (FK) relationship to a column in another table and that the referenced column has seventy-eight values.

As a first step in the fifth embodiment, the algorithm analyzes the domain knowledge. In this step, in this scenario, based on the input the algorithm determines to generate a data dictionary based on integer values since there are: a) no violators, and b) an FK constraint.

As a second step in the fifth embodiment, the algorithm analyzes the parameters. In this scenario, the algorithm sets the variability parameter to "very low" since the FK relationship to a reference data table is indicating a slowly changing value set. As a third step in the fifth embodiment, the algorithm determines a compression strategy for data dictionary. In this scenario, the algorithm determines to build the data dictionary, for the column in the data table, using the value set of the column in the reference table.

As a fourth step in the fifth embodiment, the algorithm generates a data dictionary that includes the following parameters: a) select a dictionary based compression that contains all known values regardless of how many values are already in the column; and b) by knowing all potential values an order preserving dictionary is generated, which provides an increase in query processing.

Note that the algorithm generates the same type of data dictionary (as in the fifth embodiment) under the following conditions: a) Data profiling with cross-domain analysis detects that the values in the column of the data table are the same as in the column of the reference table; b) since the row count in the column of the data table is much larger (over 1 million) the algorithm determines a high probability that the column in the data table has a FK relationship to a column in the reference table; and c) the algorithm determines that the FK relationship is not explicitly declared on database level and thus not in the database catalog.

Figure 5:
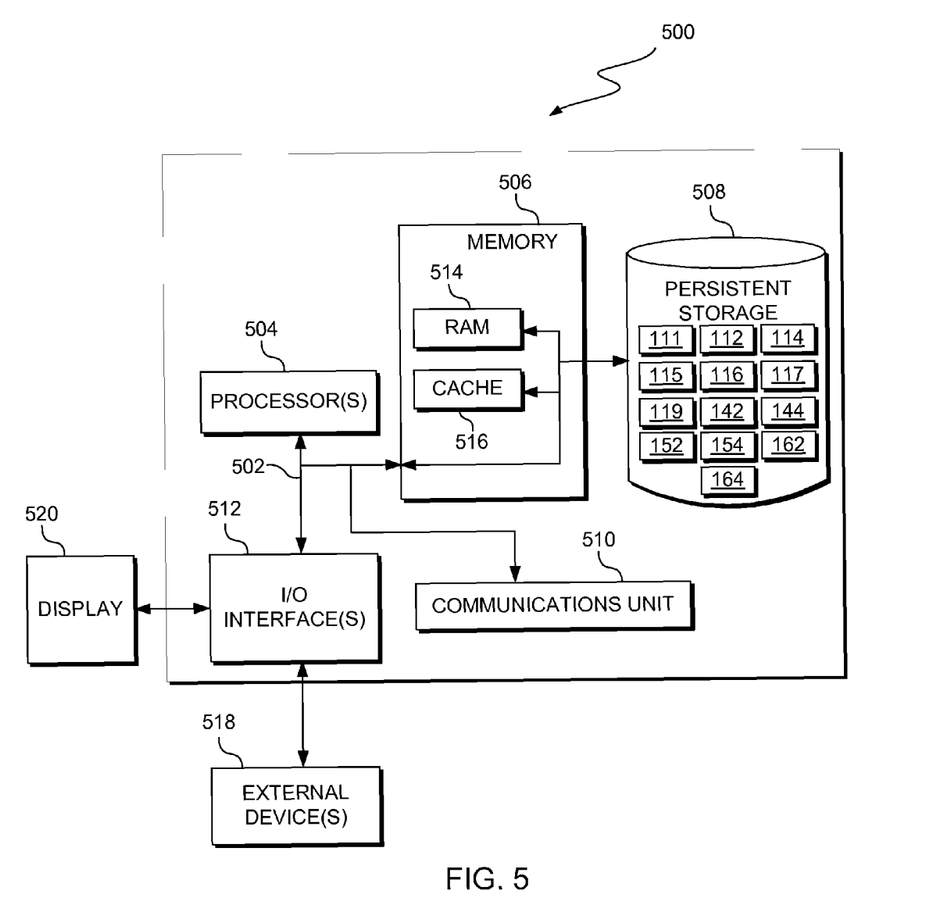
FIG. 5 depicts a block diagram of components of both the computing device executing the database dictionary program, and of databases of database management environment of FIG. 1, in accordance with one embodiment of the present invention.

FIG. 5 depicts a block diagram, 500, of components of computing device 110 executing database dictionary program 111, and of databases 140, 150 and 160 of FIG. 1, in accordance with one embodiment of the present invention. It should be appreciated that FIG. 5 provides only an illustration of one implementation and does not imply any limitations with regard to the environments in which different embodiments may be implemented. Many modifications to the depicted environment may be made.

Computing device 110 and databases 140, 150 and 160 respectively include communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Database dictionary program 111, compression interface 115, compressor algorithms 117, compressor persistency 119, metadata catalog 112, profiled databases 114, data profiler 116, tables 142, 152 and 162, and catalogs 144, 154 and 164 are stored in persistent storage 508 for execution and/or access by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices, including resources of network 130. In these examples, communications unit 510 includes one or more network interface cards. Communications unit 510 may provide communications through the use of either one or both of physical and wireless communications links. Database dictionary program 111, compression interface 115, compressor algorithms 117, compressor persistency 119, metadata catalog 112, profiled databases 114, data profiler 116, tables 142, 152 and 162, and catalogs 144, 154 and 164 may be downloaded to persistent storage 508 through communications unit 510.

I/O interface(s) 512 allows for input and output of data with other devices that may be connected to computing device 130. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., database dictionary program 111, compression interface 115, compressor algorithms 117, compressor persistency 119, metadata catalog 112, profiled databases 114, data profiler 116, tables 142, 152 and 162, and catalogs 144, 154 and 164 can be stored on such portable computer-readable storage media and can be loaded onto persistent storage 508 via I/O interface(s) 512. I/O interface(s) 512 also connect to a display 520.

Display 520 provides a mechanism to display data to a user and may be, for example, a computer monitor, or a television screen.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

It is to be noted that the term(s) "Smalltalk" and the like may be subject to trademark rights in various jurisdictions throughout the world and are used here only in reference to the products or services properly denominated by the marks to the extent that such trademark rights may exist.

What is claimed is:

1. A computer program product for determining a data dictionary for data dictionary compression, the computer program product comprising:
   one or more computer-readable non-transitory storage media and program instructions stored on the one or more computer-readable non-transitory storage media, the program instructions comprising:
   program instructions to receive statistical information about a data set included in a column of a data table;
   program instructions to receive domain knowledge about the data set that indicates one or both of a data format utilized by the data set and a type of information represented by the data set;
   program instructions to analyze retrieved data from one or more sources to provide information about one or more aspects of the data set, wherein the retrieved data comprise metadata, database statistics, data profiling and user input;
   program instructions to predict one or both of a type of data and a quantity of that data that will be received at a later time based on the domain knowledge; and
   program instructions to generate a data dictionary for compression of the data set based, on the statistical information and the domain knowledge, wherein the data dictionary is generated such that the data dictionary is capable of compressing data that is predicted to be received at the later time.

2. The computer program product of claim 1, the program instructions further comprising:
   program instructions to generate at least a portion of the domain knowledge based, at least in part, on a result of that retrieved data analysis.

3. The computer program product of claim 1, wherein the domain knowledge about the data set includes at least one of: data constraints, declared data types, inferred data types, expressions included in the data set, patterns identified in the data set, monotony of values in the data set, variability of values in the data set, value ranges in the data set, excluded value ranges in the data set, and growth range of values in the data set.

4. The computer program product of claim 1, wherein the data dictionary is configured to support both data compression and one or more of: arithmetic operations, order preservation, and fixed length encoding.

5. The computer program product of claim 1, the program instructions further comprising:
program instructions to modify the data dictionary such that the data dictionary is configured to accommodate one or both of the type of data and the quantity of that data that is predicted to be received.

6. The computer program product of claim 1, the program instructions further comprising:
program instructions to determine a number of values included in the data set;
program instructions to determine whether the number at least meets a threshold that indicates a minimum quantity of values needed to build the data dictionary; and
program instructions to respond to a determination that the number is below the threshold, by building the data dictionary based, at least in part, on a number of common suffixes that are included in the data set.

7. The computer program product of claim 1, the program instructions further comprising:
program instructions to compress the data set based, at least in part, on the data dictionary, wherein the data dictionary is a columnar dictionary that is configured to reduce encoding and decoding costs of the data set by exploiting metadata about data that is included in a column that is compressed.

8. A computer system for determining a data dictionary for data dictionary compression, the computer system comprising: one or more computer processors; one or more computer readable non-transitory storage medium;
program instructions stored on the computer readable non-transitory storage medium for execution by at least one of the one or more processors, the program instructions comprising:
program instructions to receive statistical information about a data set included in a column of a data table;
program instructions to receive additional information domain knowledge about the data set that indicates one or both of a data format utilized by the data set and a type of information represented by the data set;
program instructions to analyze retrieved data from one or more sources to provide information about one or more aspects of the data set, wherein the retrieved data comprise metadata, database statistics, data profiling and user input;
program instructions to predict one or both of a type of data and a quantity of that data that will be received at a later time; and
program instructions to generate a data dictionary for compression of the data set based, on the statistical information and the domain knowledge, wherein the data dictionary is generated such that the data dictionary.

9. The computer system of claim 8, the program instructions further comprising:
program instructions to generate at least a portion of the domain knowledge based, at least in part, on a result of that retrieved data analysis.

10. The computer system of claim 8, wherein the domain knowledge about the data set includes at least one of: data constraints, declared data types, inferred data types, expressions included in the data set, patterns identified in the data set, monotony of values in the data set, variability of values in the data set, value ranges in the data set, excluded value ranges in the data set, and growth range of values in the data set.

11. The computer system of claim 8, wherein the data dictionary is configured to support both data compression and one or more of: arithmetic operations, order preservation, and fixed length encoding.

12. The computer system of claim 8, the program instructions further comprising:
program instructions to modify the data dictionary such that the data dictionary is configured to accommodate one or both of the type of data and the quantity of that data that is predicted to be received.

13. The computer system of claim 8, the program instructions further comprising:
program instructions to determine a number of values included in the data set;
program instructions to determine whether the number at least meets a threshold that indicates a minimum quantity of values needed to build the data dictionary; and
program instructions to respond to a determination that the number is below the threshold, by building the data dictionary based, at least in part, on a number of common suffixes that are included in the data set.

* * * * *